United States Patent
Goenka

Patent Number: 6,111,204
Date of Patent: Aug. 29, 2000

[54] BOND PADS FOR FINE-PITCH APPLICATIONS ON AIR BRIDGE CIRCUIT BOARDS

[75] Inventor: Lakhi Nandlal Goenka, Ann Arbor, Mich.

[73] Assignee: Ford Motor Company, Dearborn, Mich.

[21] Appl. No.: 09/246,864

[22] Filed: Feb. 8, 1999

[51] Int. Cl.[7] .................................................. H05K 1/09
[52] U.S. Cl. ...................... 174/257; 174/250; 174/261; 361/748; 361/774; 361/777; 216/13; 216/15
[58] Field of Search ........................... 361/748, 772–774, 361/777, 778; 174/250, 253, 256, 257, 261; 257/276, 522, 737, 775, 776; 438/614, 619, 652, 673, 713; 29/830, 842, 846, 874; 228/180.22; 216/13, 15; 439/78, 510

[56] References Cited

U.S. PATENT DOCUMENTS

| | | | |
|---|---|---|---|
| 3,801,388 | 4/1974 | Akiyama et al. | 216/20 |
| 4,404,059 | 9/1983 | Livshits et al. | 216/17 |
| 4,561,173 | 12/1985 | Te Velde | 438/619 |
| 5,738,797 | 4/1998 | Belke, Jr. et al. | 216/16 |

Primary Examiner—Leo P. Picard
Assistant Examiner—John B. Vigushin
Attorney, Agent, or Firm—Leslie C. Hodges

[57] ABSTRACT

An etched tri-metal-layer air bridge circuit board specially designed for fine-pitch applications, comprising: an electrically insulative substrate surface, a plurality of tri-metal-layer bond pads arranged in a generally straight row on the substrate surface wherein the row defines a width direction therealong, and a circuit trace arranged on the substrate surface, wherein the circuit trace runs between two adjacent ones of the plurality of tri-metal-layer bond pads. Each bond pad comprises: (1) a bottom layer attached to the substrate surface, the bottom layer being made of a first metal and having an overall width W1 as measured along the width direction; (2) a top layer disposed above and generally concentric with the bottom layer, the top layer being made of the first metal and having an overall width W2 as measured along the width direction; and (3) a middle layer made of a second metal connecting the bottom layer and the top layer. The bond pads are specially shaped such that W2>W1 for at least the two adjacent bond pads, thus enabling the circuit trace to be spaced closely to the bottom layers of the two adjacent bond pads, while allowing the top layers of the pads to be made much larger so as to avoid delamination thereof from their associated middle layers.

20 Claims, 3 Drawing Sheets

BOND PADS FOR FINE-PITCH APPLICATIONS ON AIR BRIDGE CIRCUIT BOARDS

BACKGROUND OF THE INVENTION

1. Field of the Invention

The present invention relates generally to air bridge printed circuit boards, and more particularly to bond pads for fine-pitch applications on air bridge circuit boards.

2. Disclosure Information

U.S. Pat. Nos. 4,404,059 to Livshits et al. (hereinafter "Livshits"), 3,801,388 to Akiyama et al. (hereinafter "Akiyama"), and 5,738,797 to Belke et al. (hereinafter "Belke"), all three of which are incorporated herein by reference, disclose methods for making printed circuit boards (PCBs) comprising a substrate with etched tri-metal-layer (ETM) circuitry thereon, wherein the circuitry includes a plurality of air bridge crossover circuits. Because such circuits are produced by various chemical etching steps, care must be taken not to make certain portions of the circuits too small or narrow; otherwise, these small/narrow portions may become delaminated from the rest of the circuit, either during etching (because of the aggressive undercutting of the etching process) or during processing/use of the PCB (because of thermal, mechanical, or other stresses encountered).

This presents a particular problem for fine-pitch ETM applications, where the bond pad portions of the circuit must be closely spaced, while also providing sufficient spacing between adjacent pads for circuit traces to pass therebetween. FIGS. 1–2 illustrate top and side section views of an ETM circuit for a non-fine-pitch application with a relatively wide pitch P1, FIGS. 3–4 illustrate a much tighter (but not quite fine-pitch) application where the centerline-to-centerline pad pitch P2 is smaller than P1 but with the pads having the same width, and FIGS. 5–6 illustrate an attempt at a fine-pitch application where the pitch P3 is smaller than P2, as well as the bond pad width being made smaller. Note that in order to get the pads of FIGS. 5–6 tightly spaced as desired, not only does the centerline-to-centerline pitch P3 need to be made small, but the width of the pads must be shrunk as well. Moreover, adding in the traces between adjacent pads requires the pads to be made smaller still. However, when the width of the pads gets below a certain size—say 35 mils for 2-mil/6-mil/2-mil tri-layer-metal circuits—there is a tendency for the top layer of each pad to delaminate from the middle layer, causing shorts, opens, and/or other circuit problems. It would be desirable, therefore, to provide a way to accommodate fine-pitch applications for ETM circuits which avoids this tendency toward top layer delamination.

SUMMARY OF THE INVENTION

The present invention overcomes the disadvantages of the prior art approaches by providing an ETM air bridge circuit board specially designed for fine-pitch applications, while avoiding the aforementioned delamination problem. The board comprises: an electrically insulative substrate surface, a plurality of tri-metal-layer bond pads arranged in a generally straight row on the substrate surface wherein the row defines a width direction therealong, and a circuit trace arranged on the substrate surface, wherein the circuit trace runs between two adjacent ones of the plurality of tri-metal-layer bond pads. Each bond pad comprises: (1) a bottom layer attached to the substrate surface, the bottom layer being made of a first metal and having an overall width W1 as measured along the width direction; (2) a top layer disposed above and generally concentric with the bottom layer, the top layer being made of the first metal and having an overall width W2 as measured along the width direction; and (3) a middle layer made of a second metal connecting the bottom layer and the top layer. The bond pads are specially shaped such that W2>W1 for at least the two adjacent bond pads, thus enabling the circuit trace to be spaced closely to the bottom layers of the two adjacent bond pads, while allowing the top layers of the pads to be made much larger so as to avoid delamination thereof from their associated middle layers.

It is an object and advantage of the present invention that the bond pads are specially shaped such that W2>W1 for at least the two adjacent bond pads, thus enabling the circuit trace to be spaced closely to the bottom layers of the two adjacent bond pads, while allowing the top layers of the pads to be made much larger so as to avoid delamination thereof from their associated middle layers.

Another advantage is that the present invention may be easily incorporated into existing or new ETM circuit designs with minimal effort, and without the need for special equipment or processing.

These and other advantages, features and objects of the invention will become apparent from the drawings, detailed description and claims which follow.

DETAILED DESCRIPTION OF THE PREFERRED EMBODIMENTS

Figure 7:
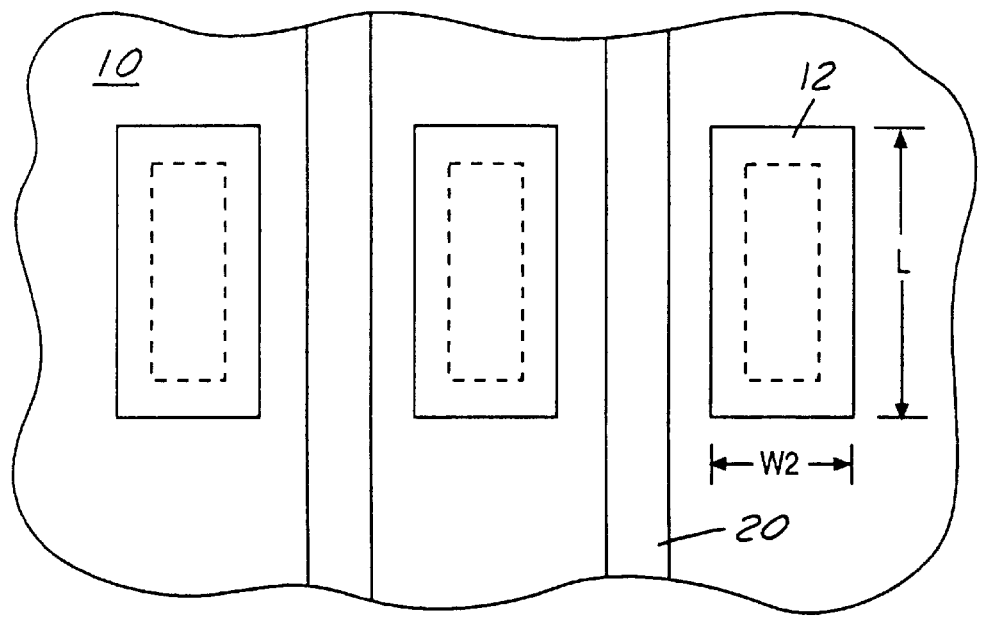
FIGS. 7–8 are top and side views, respectively, of ETM circuit bond pads for a fine-pitch application, according to the present invention.
Figure 8:
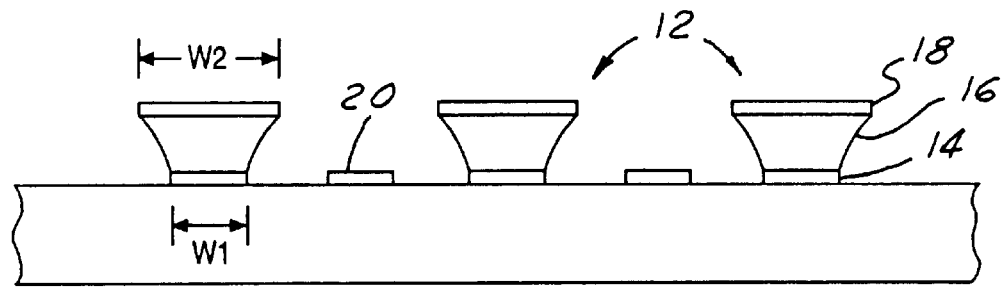

Referring now to the drawings, FIGS. 7–8 show an etched tri-metal-layer air bridge circuit board specially designed for fine-pitch applications according to the present invention. The board comprises: (A) an electrically insulative substrate surface; (B) a plurality of tri-metal-layer bond pads arranged in a generally straight row on the substrate surface wherein the row defines a width direction therealong, each bond pad comprising: (B1) a bottom layer attached to the substrate surface, the bottom layer being made of a first metal and having an overall width W1 as measured along the width direction; (B2) a top layer disposed above and generally concentric with the bottom layer, the top layer being made of the first metal and having an overall width W2 as measured along the width direction; and (B3) a middle layer made of a second metal connecting the bottom layer and the top layer; and (C) a circuit trace arranged on the substrate surface and being made of the first metal, wherein the circuit trace runs between two adjacent ones of the plurality of tri-metal-layer bond pads; (D) wherein W2>W1 for at least the two adjacent bond pads. Note particularly that the bond pads are specially shaped such that W2>W1 for at least the two adjacent bond pads, thus enabling the circuit trace to be spaced closely to the bottom layers of the two adjacent bond pads, while allowing the top layers of the pads to be made much larger so as to avoid delamination thereof from their associated middle layers.

Figure 1:
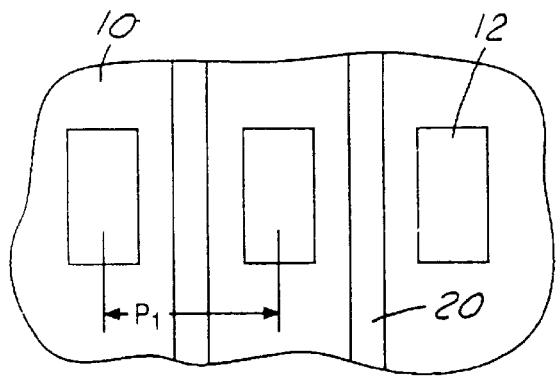
FIGS. 1–2 are top and side views, respectively, of ETM circuit bond pads for non-fine-pitch applications according to the prior art.
Figure 3:
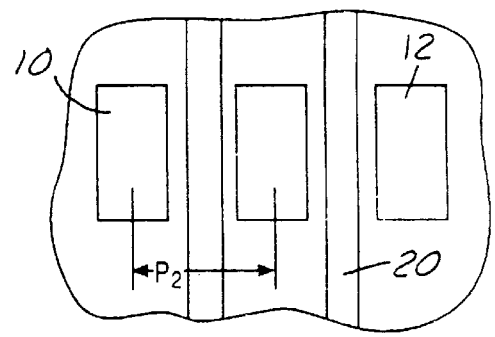
FIGS. 3–4 are top and side views, respectively, of ETM circuit bond pads for a finer-pitch application than FIGS. 1–2, according to the prior art.
Figure 2:
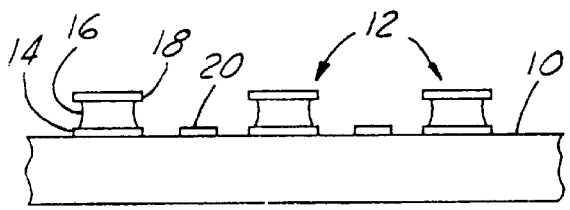
Figure 4:
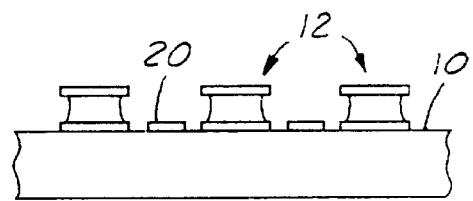
Figure 5:
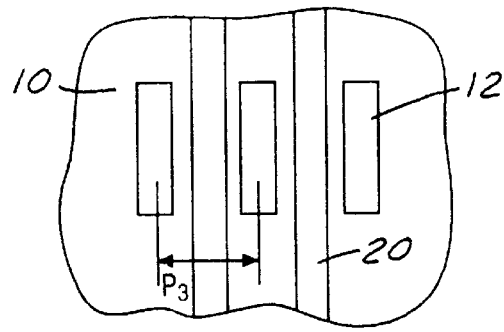
FIGS. 5–6 are top and side views, respectively, of ETM circuit bond pads for a fine-pitch application showing delaminated top pad layers, according to the prior art.
Figure 6:
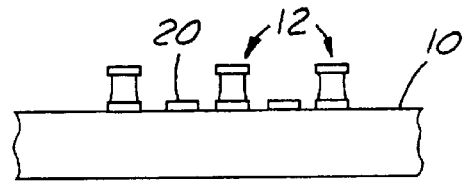

To assist the reader in understanding the present invention, all reference numbers used herein are summarized in the table below, along with the elements they represent:

| | |
|---|---|
| 10 = | Substrate surface |
| 12 = | Bond pad |
| 14 = | Bottom layer of bond pad |
| 16 = | Middle layer of bond pad |
| 18 = | Top layer of bond pad |
| 20 = | Circuit trace |
| 22 = | Adjacent edges of two adjacent top layers |
| 24 = | Portion of top layer having narrower width |
| L = | Overall length of bond pad |
| L1 = | Overall length of bottom layer of bond pad |
| L2 = | Overall length of top layer of bond pad |
| W1 = | Overall width of bottom layer of bond pad |
| W2 = | Overall width of top layer of bond pad |
| W3 = | Width of optional narrower top layer portion |
| P1 = | Pitch between pads (FIGS. 1–2) |
| P2 = | Pitch between pads (FIGS. 3–4) |
| P3 = | Pitch between pads (FIGS. 5–6) |

The bond pads 12 are typically generally rectangular or generally capsule-shaped as viewed from above, as is the case with conventional bond pads on FR-4, flex, or ETM substrates. Also, each pad 12 has an overall length L as measured along a direction generally orthogonal to the width direction, such that L>W. These features generally conform with conventional bond pads.

Figure 9:
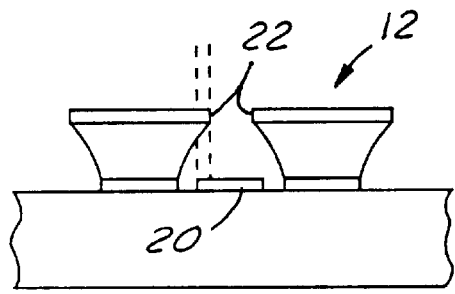
FIGS. 9–10 are side and top views, respectively, of alternative embodiments of the present invention.

However, unlike any heretofore known conventional bond pad, the pads according to the present invention have a bottom layer 14 whose width W1 is smaller than the width W2 of the pad's top layer 18. Each middle layer 16 generally transitions in width from a smaller width (typically a little smaller than W1) proximate the bottom layer 14 to a larger width (typically a little smaller than W2) proximate the top layer 18. This kind of "top-heavy" configuration is particularly evident in FIG. 8, which shows such bond pads 12 from a side view. With the pads configured in this way, the pads 12 may be placed very closely together while allowing more room than is provided in prior art cases for a circuit trace 20 to run therebetween. In fact, it is even possible to place the trace 20 and adjacent pads 12 so close together that the adjacent/neighboring top layer edges 22 of two adjacent/neighboring pads 12 actually extend over the circuit trace 12 somewhat, as illustrated in FIG. 9.

It is preferred that the first and second metals be copper and aluminum, respectively, although many other selectively etchable metal combinations are possible, as taught in Livshits, Belke, and Akiyama. Such bond pads as disclosed herein may be produced either by subtractive methods (e.g., Akiyama) or by additive methods (e.g., Livshits). In either case, the plating/etching masks that are used should be designed such that the bond pad's top layer width W2 is larger than the bottom layer width W1.

Figure 10:
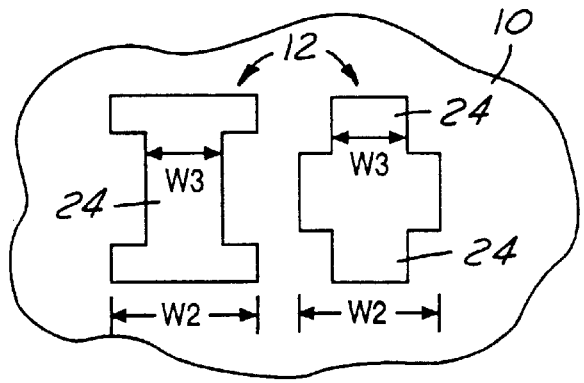

It may also be desirable to produce the pads such that at least one portion 24 of the top layer has a width W3 narrower than the overall top layer width W1, as illustrated in FIG. 10, thus producing pads with notches or reliefs therein. Such notches/reliefs may be beneficial for mitigating skew of component leads thereon, caused by surface tension forces in the molten solder during reflow.

Figure 11:
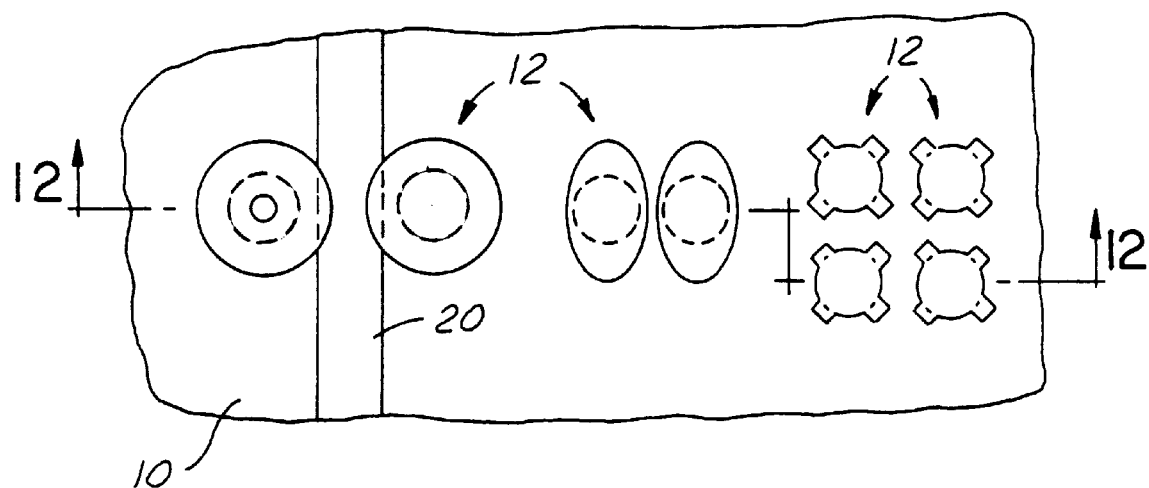
FIGS. 11–12 are top and sectional side views, respectively, of additional alternative embodiments of the present invention.
Figure 12:
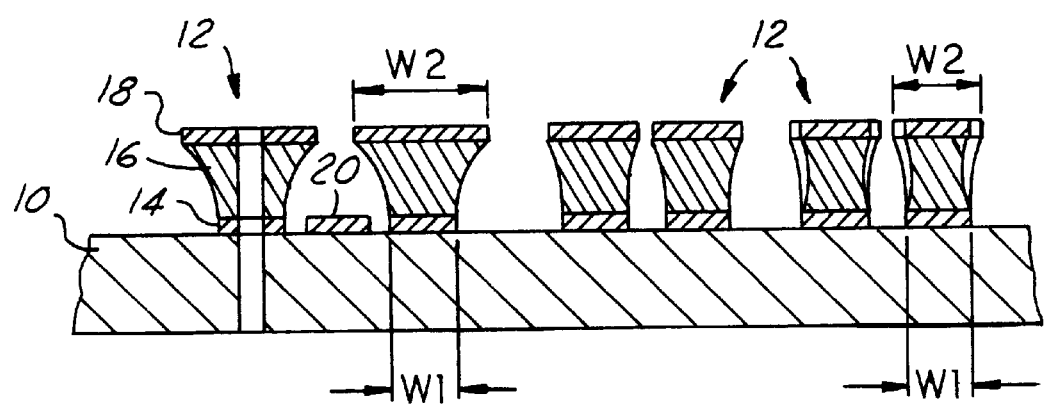

Various other modifications to the present invention may occur to those skilled in the art to which the present invention pertains. For example, as illustrated in FIGS. 11–12, the pads 12 may be generally round or oval as viewed from above. These round or oval pads 12 may have optional through-holes defined therethrough, and/or may have optional "tabs" or "wings" extending outward from the otherwise round or oval periphery thereof, thus providing somewhat of a "star" shape thereto. Also, note in FIG. 11 that the top bond pad layer 18 of the oval pads is wider/longer than the corresponding bottom layer 14 (i.e., L2>L1), not only in the width direction, but also (and especially) in the "length direction" (i.e., as measured orthogonal to the width direction); this configuration permits very close spacing of adjacent pads, because the additional top layer length L2 is provided in the direction orthogonal to the spacing direction. In fact, in this configuration the widths W2/W1 of the top and bottom layers 18/14 may be generally the same, with only the lengths L2/L1 thereof differing. Other modifications not explicitly mentioned herein are also possible and within the scope of the present invention. It is the following claims, including all equivalents, which define the scope of the present invention.

What is claimed is:

1. A circuit board assembly for accommodating fine-pitch applications, comprising:
   (a) an electrically insulative substrate surface;
   (b) a plurality of tri-metal-layer bond pads arranged in a generally straight row on said substrate surface wherein said row defines a width direction therealong, each bond pad comprising:
      (i) a bottom layer attached to said substrate surface, said bottom layer being made of a first metal and having an overall width W1 as measured along said width direction;
      (ii) a top layer disposed above and generally concentric with said bottom layer, said top layer being made of said first metal and having an overall width W2 as measured along said width direction; and
      (iii) a middle layer made of a second metal connecting said bottom layer and said top layer; and
   (c) a circuit trace arranged on said substrate surface and being made of said first metal, wherein said circuit trace runs between two adjacent ones of said plurality of tri-metal-layer bond pads;
   (d) wherein W2>W1 for at least said two adjacent bond pads.

2. An etched tri-metal-layer circuit board according to claim 1, wherein each middle layer of said bond pads transitions in width from a smaller width proximate said bottom layer to a larger width proximate said top layer.

3. An etched tri-metal-layer circuit board according to claim 1, wherein each pad has an overall length L as measured along a direction generally orthogonal to said width direction, such that L>W.

4. An etched tri-metal-layer circuit board according to claim 1, wherein adjacent top layer edges of said two adjacent bond pads extend over said circuit trace.

5. An etched tri-metal-layer circuit board according to claim 1, said first metal is copper and said second metal is aluminum.

6. An etched tri-metal-layer circuit board according to claim 1, wherein each bond pad is generally rectangular as viewed from above said substrate surface.

7. An etched tri-metal-layer circuit board according to claim 1, wherein each bond pad is generally capsule-shaped as viewed from above said substrate surface.

8. An etched tri-metal-layer circuit board according to claim 1, wherein each bond pad has at least one portion thereof having a width narrower than said overall width.

9. An air bridge circuit board assembly for accommodating fine-pitch applications while avoiding delamination, comprising:
(a) an electrically insulative substrate surface;
(b) a plurality of tri-metal-layer bond pads arranged in a generally straight row on said substrate surface wherein said row defines a width direction therealong, each bond pad comprising:
   (i) a bottom layer attached to said substrate surface, said bottom layer being made of a first metal and having an overall width W1 as measured along said width direction;
   (ii) a top layer disposed above and generally concentric with said bottom layer, said top layer being made of said first metal and having an overall width W2 as measured along said width direction; and
   (iii) a middle layer made of a second metal connecting said bottom layer and said top layer; and
(c) a circuit trace arranged on said substrate surface and being made of said first metal, wherein said circuit trace runs between two adjacent ones of said plurality of tri-metal-layer bond pads;
(d) wherein W2>W1 for at least said two adjacent bond pads, and
(e) wherein each middle layer of said bond pads transitions in width from a smaller width proximate said bottom layer to a larger width proximate said top layer.

10. An etched tri-metal-layer circuit board according to claim 9, wherein each pad has an overall length L as measured along a direction generally orthogonal to said width direction, such that L>W.

11. An etched tri-metal-layer circuit board according to claim 9, wherein adjacent top layer edges of said two adjacent bond pads extend over said circuit trace.

12. An etched tri-metal-layer circuit board according to claim 9, said first metal is copper and said second metal is aluminum.

13. An etched tri-metal-layer circuit board according to claim 9, wherein each bond pad is generally rectangular as viewed from above said substrate surface.

14. An etched tri-metal-layer circuit board according to claim 9, wherein each bond pad is generally capsule-shaped as viewed from above said substrate surface.

15. An etched tri-metal-layer circuit board according to claim 9, wherein each bond pad has at least one portion thereof having a width narrower than said overall width.

16. An air bridge circuit board assembly for accommodating fine-pitch applications while avoiding delamination, comprising:
(a) an electrically insulative substrate surface;
(b) a plurality of tri-metal-layer bond pads arranged in a generally straight row on said substrate surface wherein said row defines a width direction therealong and a length direction orthogonal thereto, each bond pad comprising:
   (i) a bottom layer attached to said substrate surface, said bottom layer being made of a first metal and having an overall length L1 as measured along said length direction;
   (ii) a top layer disposed above and generally concentric with said bottom layer, said top layer being made of said first metal and having an overall length L2 as measured along said length direction; and
   (iii) a middle layer made of a second metal connecting said bottom layer and said top layer; and
(c) a circuit trace arranged on said substrate surface and being made of said first metal, wherein said circuit trace runs between two adjacent ones of said plurality of tri-metal-layer bond pads;
(d) wherein L2>L1 for at least said two adjacent bond pads; and
(e) wherein each middle layer of said bond pads transitions in length from a smaller length proximate said bottom layer to a larger length proximate said top layer.

17. An etched tri-metal-layer circuit board according to claim 16, wherein adjacent top layer edges of said two adjacent bond pads extend over said circuit trace.

18. An etched tri-metal-layer circuit board according to claim 16, said first metal is copper and said second metal is aluminum.

19. An etched tri-metal-layer circuit board according to claim 16, wherein each bond pad is generally rectangular, generally capsule-shaped, generally circular, generally oval, or generally star-shaped as viewed from above said substrate surface.

20. An etched tri-metal-layer circuit board according to claim 16, wherein each bond pad has at least one portion thereof having a length narrower than said overall length.

* * * * *